(12) United States Patent
Sotome

(10) Patent No.: US 8,547,698 B2
(45) Date of Patent: Oct. 1, 2013

(54) COOLING STRUCTURE OF CAPACITOR AND INVERTER DEVICE

(75) Inventor: Hideyuki Sotome, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 186 days.

(21) Appl. No.: 13/158,926

(22) Filed: Jun. 13, 2011

(65) Prior Publication Data

US 2012/0020025 A1 Jan. 26, 2012

(30) Foreign Application Priority Data

Jul. 23, 2010 (JP) ................................. 2010-165883

(51) Int. Cl.
*H05K 7/20* (2006.01)
(52) U.S. Cl.
USPC ........... 361/704; 361/690; 361/707; 361/709; 361/719; 165/80.3
(58) Field of Classification Search
None
See application file for complete search history.

(56) References Cited

U.S. PATENT DOCUMENTS

| | | | | |
|---|---|---|---|---|
| 5,305,185 | A * | 4/1994 | Samarov et al. | 361/704 |
| 5,313,361 | A * | 5/1994 | Martin | 361/699 |
| 6,434,006 | B1 * | 8/2002 | Fukatsu et al. | 361/704 |
| 6,459,586 | B1 * | 10/2002 | Miller et al. | 361/719 |
| 6,650,559 | B1 * | 11/2003 | Okamoto et al. | 363/141 |
| 6,972,959 | B2 * | 12/2005 | Asai et al. | 361/719 |
| 7,643,297 | B2 * | 1/2010 | Tominaga et al. | 361/704 |
| 8,184,438 | B2 * | 5/2012 | Kaneko et al. | 361/705 |
| 2005/0285519 | A1 | 12/2005 | Cok | |

FOREIGN PATENT DOCUMENTS

| | | |
|---|---|---|
| DE | 10-2005-041051 A1 | 3/2006 |
| EP | 2 328 265 A1 | 6/2011 |
| JP | 60-110145 A | 6/1985 |
| JP | 6-77631 A | 3/1994 |
| JP | 07-111380 A | 4/1995 |
| JP | 2000-306764 A | 11/2000 |
| JP | 2001-015645 A | 1/2001 |
| JP | 2001-186778 A | 7/2001 |
| JP | 2001-326318 A | 11/2001 |
| JP | 2003-257701 A | 9/2003 |
| JP | 2007-123644 A | 5/2007 |
| JP | 2008-504653 A | 2/2008 |
| JP | 2008-113511 A | 5/2008 |
| JP | 2010-074935 A | 4/2010 |
| WO | 2010-032473 A1 | 3/2010 |

OTHER PUBLICATIONS

German Office Action, dated Mar. 4, 2012.
Japanese Office Action, dated May 22, 2012.
Japanese Office Action Issued Dec. 12, 2012 in Japanese Patent Application No. 2010-165883 English Translation.
Japanese Office Action, dated Jun. 18, 2013, Patent Application No. 2010-165883.

\* cited by examiner

*Primary Examiner* — Boris Chervinsky
(74) *Attorney, Agent, or Firm* — Sughrue Mion, PLLC

(57) ABSTRACT

A cooling structure of a capacitor includes a snubber capacitor in which lead terminals are joined to external electrodes of a laminated ceramic electronic component; a circuit board which is for mounting the snubber capacitor and semiconductor switching elements; and a heat dissipation plate which is made of metal that dissipates the heat generated in the circuit board. The cooling structure of the capacitor is configured such that an insulating member having a high coefficient of thermal conductivity intervenes between the snubber capacitor and the heat dissipation plate.

9 Claims, 7 Drawing Sheets

COOLING STRUCTURE OF CAPACITOR AND INVERTER DEVICE

BACKGROUND OF THE INVENTION

1. Field of the Invention

The present invention relates to capacitors consisting of ceramic electronic components to be mounted on circuit boards and, more particularly, relates to a cooling structure of a snubber capacitor and an inverter device using the cooling structure of the capacitor.

2. Description of the Related Art

In recent years, motors equipped with inverters have become widespread from the flow of energy saving. FIG. 6 is an example of a circuit diagram of a three phase inverter which is for driving a motor 12. As shown in the drawing, a plurality of semiconductor switching elements 2 (when named generically, additional characters will not be repeated later), each of the plurality of semiconductor switching elements 2 consisting of a corresponding one of semiconductor switching elements 2a, 2c, and 2e on the upper arm side and a corresponding one of semiconductor switching elements 2b, 2d, and 2f on the lower arm side, are included in each of U phase, V phase, and W phase; and the semiconductor switching elements 2 are connected to a power source 13 via wiring inductances 11a. Furthermore, a snubber capacitor 1 is connected in parallel between the respective semiconductor switching elements of the upper and lower arms via wiring inductances 11b.

The aforementioned snubber capacitor 1 is used for suppressing a surge voltage generated in switching the semiconductor switching elements 2. The surge voltage $\Delta V$ is found by an equation $\Delta V = -L(di/dt)$ when a main circuit inductance of the inverter device is set to "L." When the surge voltage increases, capacitor capacitance required for obtaining a sufficient effect of surge elimination increases; and accordingly, the whole of the inverter device becomes larger in size.

In order to reduce the main circuit inductance, a parasitic inductance that arises in association with an external wiring which connects a smoothing capacitor to the semiconductor switching element and an internal wiring which connects the snubber capacitor to the semiconductor switching element needs to be reduced; and therefore, it is preferable to arrange the snubber capacitor 1 in the vicinity of the semiconductor switching element 2 to reduce the parasitic inductance.

Furthermore, in recent years, the switching speed of the semiconductor switching element is required to be increased; and in the aforementioned snubber capacitor 1, a capacitor with low impedance (equivalent series resistance (ESR)) at a high frequency is preferable. In addition, an impedance (ESR) component contained in the capacitor causes heat generation; and therefore, the capacitor with low impedance (ESR) is preferable.

From such a background, a laminated ceramic capacitor which is low impedance (ESR) at the high frequency side and is capable of being arranged in the vicinity of the semiconductor switching element has been widely used as the snubber capacitor 1.

However, as in the inverter device for use in an automobile, mechanical stress is generated due to the difference of coefficients of thermal expansion between the laminated ceramic capacitor and a circuit board to which the laminated ceramic capacitor is mounted in circumstances whose temperature change and temperature cycle are large; and accordingly, a crack may be generated in the laminated ceramic capacitor.

More particularly, in the case where a metal circuit board serving as a high heat dissipation substrate has a large coefficient of thermal expansion and the laminated ceramic capacitor is mounted on the metal circuit board, a problem exists in that the occurrence of the crack caused by the difference of the coefficients of thermal expansion becomes prominent and accordingly reliability of the capacitor cannot be sufficiently kept.

Consequently, for example, a laminated ceramic capacitor 1a is used as the capacitor 1 as shown in FIG. 7. The laminated ceramic capacitor 1a in which lead terminals 103 formed by processing a metal plate are attached to external electrodes 102 of a ceramic electronic component element 101 is mounted on a circuit board or the like via the lead terminals 103; and accordingly, mechanical stress caused by the difference of coefficients of thermal expansion between the ceramic electronic component element 101 and the circuit board is reduced.

Furthermore, in a laminated ceramic capacitor 1b used as the capacitor 1 shown in FIG. 8, lead terminals 103 are attached to metal plates 104 joined to external electrodes 102 by applying conductive paste to the external electrodes 102 on both ends of a ceramic electronic component element 101; and accordingly, the laminated ceramic capacitor 1b in which the joining strength of the lead terminals 103 is excellent and reliability is high can be obtained. (See Patent Document 1.)

In addition, in a laminated ceramic capacitor 1c used as the capacitor 1 shown in FIG. 9, material 107 having a thermal expansion coefficient, which is larger than a thermal expansion coefficient of a ceramic electronic component element 101 and smaller than a thermal expansion coefficient of a metal substrate of aluminum, is made to intervene between the ceramic electronic component element 101 and the metal substrate (not shown in the drawing) whose base plate is made of aluminum, and electrically-conducting paths 106 being in contact with external electrodes 102 of the ceramic electronic component element 101 are joined by solder 105; and accordingly, the laminated ceramic capacitor 1c which prevents the ceramic electronic component element 101 from being cracked and has high reliability can be obtained. (See Patent Document 2.)

Further, a cooling structure of a snubber capacitor to be connected in parallel to semiconductor switching elements of an inverter circuit is configured such that the snubber capacitor is placed in a module filled with mold material in order to prevent insulation deterioration due to moisture absorption and an electrode of the snubber capacitor is connected to a conductor connected to a cooling fin for cooling semiconductor switching elements via a sheet having high insulation property and high thermal conductivity. (See Patent Document 3.)

[Patent Document]

[Patent Document 1] Japanese Unexamined Patent Publication No. 2000-306764

[Patent Document 2] Japanese Unexamined Patent Publication No. H06-077631

[Patent Document 3] Japanese Unexamined Patent Publication No. 2008-113511

By the way, in an inverter device having a large current of several hundred amperes and high speed switching, a peak current generated by a surge voltage is large and self-heating of a snubber capacitor to which the peak current flows cannot be negligible.

In the inverter device for large current as described above, the heat of the semiconductor switches, the snubber capacitors, and the like mounted on the circuit board is dissipated by using the metal substrate serving as the high heat dissipation substrate and the circuit board of a ceramic substrate. However, in the case where the conventional laminated ceramic capacitors 1a, 1b, and 1c shown in FIG. 7 to FIG. 9, whose mechanical stresses are reduced, are mounted as the snubber capacitors, paths through which the heat is dissipated to the metal substrate are limited to the lead terminals and the electrically-conducting paths. If the coefficient of thermal conductivity and the thickness of material for use in the lead terminal and the electrically-conducting path are not sufficient, the heat generated in the snubber capacitor is not sufficiently dissipated to the substrate side; and accordingly, the temperature of the laminated ceramic capacitor rises. Therefore, a problem exists in that the temperature rise of the capacitor shortens operating life of the capacitor and reduces reliability thereof.

Furthermore, the cooling structure of the snubber capacitor shown in Patent Document 3 uses the sheet having high insulation property and high thermal conductivity; however, the sheet intervenes only between the electrode of the snubber capacitor and the conductor connected to the cooling fin. The paths through which the heat is dissipated to the cooling fin are originally limited to the capacitor electrode and the conductor; and therefore, a problem exists in that if the coefficients of thermal conductivity of the material for use in the capacitor electrode and the conductor are not sufficient, the heat generated by the snubber capacitor is not still dissipated sufficiently to the cooling fin side and accordingly the temperature of the snubber capacitor rises.

BRIEF SUMMARY OF THE INVENTION

The present invention has been made to solve the foregoing problem, and an object of the present invention is to provide a cooling structure of a capacitor consisting of a ceramic electronic component in which lead terminals are joined to external electrodes to improve reliability by suppressing the temperature rise of the capacitor.

A cooling structure of a capacitor according to the present invention includes: a circuit board in which wiring patterns are formed on a metal base plate via an insulating layer; a capacitor consisting of a ceramic electronic component which is connected to the wiring patterns of the circuit board via lead terminals and has external electrodes joined to the lead terminals; a heat dissipation plate which is made of metal that dissipates the heat generated by the capacitor; and an insulating member which is provided on the upper surface or the side surface of the capacitor and intervenes between the heat dissipation plate and the capacitor, the insulating member having a high coefficient of thermal conductivity.

Furthermore, a cooling structure of a capacitor according to the present invention includes: a circuit board in which wiring patterns are formed on a metal base plate via an insulating layer; a capacitor consisting of a ceramic electronic component which is connected to the wiring patterns of the circuit board via lead terminals and has external electrodes joined to the lead terminals; and an insulating member which is provided on the inner sides of the lead terminals of the capacitor and intervenes between the circuit board and the capacitor, the insulating member having a high coefficient of thermal conductivity.

An inverter device according to the present invention includes: a circuit board in which wiring patterns are formed on a metal base plate via an insulating layer; an inverter circuit which is arranged on the circuit board and is configured by a plurality of semiconductor switching elements for converting electric power; a capacitor consisting of a ceramic electronic component which is connected to the wiring patterns of the circuit board via lead terminals in parallel to the semiconductor switching elements and has external electrodes joined to the lead terminals; a heat dissipation plate which is made of metal that dissipates the heat generated by the capacitor; and an insulating member which is provided on the upper surface or the side surface of the capacitor and intervenes between the heat dissipation plate and the capacitor, the insulating member having a high coefficient of thermal conductivity.

Furthermore, an inverter device according to the present invention includes: a circuit board in which wiring patterns are formed on a metal base plate via an insulating layer; an inverter circuit which is arranged on the circuit board and is configured by a plurality of semiconductor switching elements for converting electric power; a capacitor consisting of a ceramic electronic component which is connected to the wiring patterns of the circuit board via lead terminals in parallel to the semiconductor switching elements and has external electrodes joined to the lead terminals; and an insulating member which is provided on the inner sides of the lead terminals of the capacitor and intervenes between the circuit board and the capacitor, the insulating member having a high coefficient of thermal conductivity.

According to the present invention, an insulating member having a high coefficient of thermal conductivity is provided between a capacitor consisting of a laminated ceramic electronic component in which lead terminals are joined to external electrodes and a heat dissipation plate or a circuit board to dissipate the heat derived from the capacitor by paths together with heat dissipation paths of the lead terminals and the electrically-conducting paths; whereby, the temperature rise of the capacitor is suppressed, the capacitor can be used for long periods, and reliability can be improved.

Furthermore, a cooling structure of a snubber capacitor to be connected in parallel to semiconductor switching elements of an inverter circuit is used; whereby, an inverter device with high reliability can be provided.

The foregoing and other object, features, aspects, and advantages of the present invention will become more apparent from the following detailed description of the present invention when taken in conjunction with the accompanying drawings.

DETAILED DESCRIPTION OF THE INVENTION

Preferred Embodiment 1

Hereinafter, a cooling structure of a capacitor and an inverter device according to a preferred embodiment 1 of the present invention will be described with reference to FIG. 1.

Figure 1:
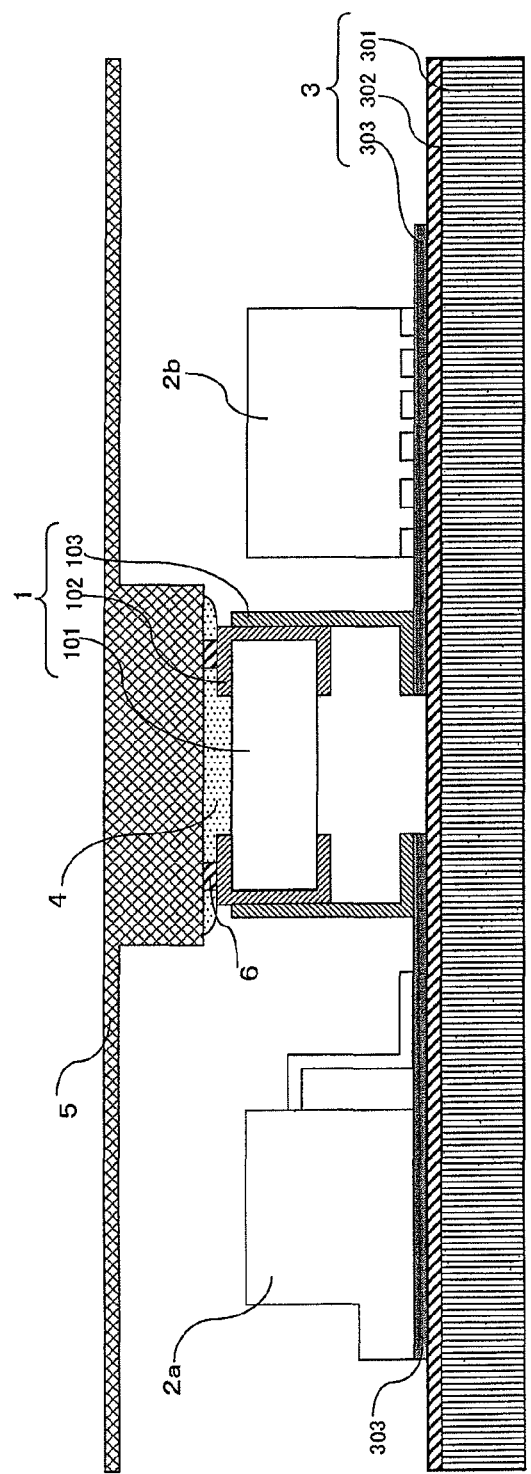
FIG. 1 is a schematic side view showing an inverter device according to a preferred embodiment 1 of the present invention.

FIG. 1 is a schematic side view showing the configuration of the cooling structure of the capacitor and the inverter device using the cooling structure of the capacitor and, in this case, the schematic side view shows only a U phase of an inverter circuit as a representative. Furthermore, an actual inverter device includes a heat sink and an inverter case; however, in this case, the heat sink and the inverter case are not shown.

As shown in FIG. 1, in the inverter device according to the preferred embodiment 1, a snubber capacitor 1 and semiconductor switching elements 2a and 2b of upper and lower arms of the inverter circuit are mounted on a metal circuit board 3. The semiconductor switching elements 2a and 2b and other semiconductor switching elements of V phase and W phase (not shown in the drawing) constitute the inverter circuit and convert electric power. The snubber capacitor 1 is connected in parallel to the semiconductor switching elements 2a and 2b.

Figure 7:
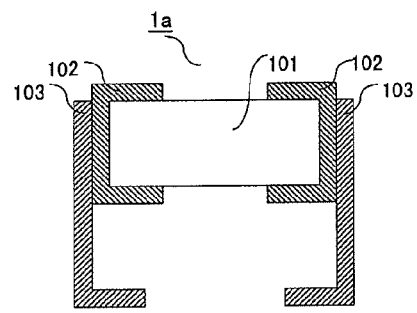
FIG. 7 is a side view showing a conventional ceramic electronic component.
Figure 8:
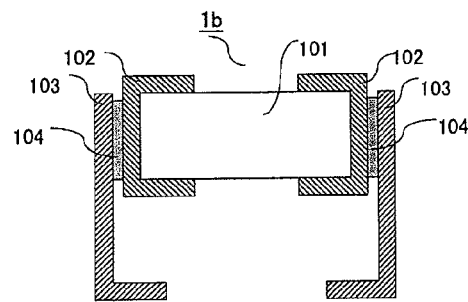
FIG. 8 is a side view showing a conventional ceramic electronic component.
Figure 9:
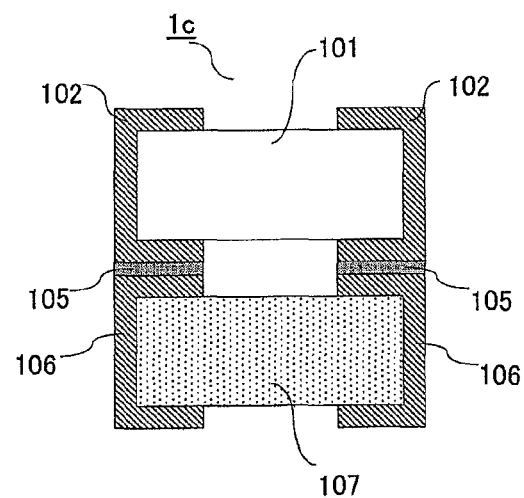
FIG. 9 is a side view showing a conventional ceramic electronic component.

The snubber capacitor 1 is a laminated ceramic capacitor in which lead terminals 103 of metal plate are connected to external electrodes 102 provided on both sides of a ceramic electronic component element 101. The laminated ceramic capacitor (snubber capacitor) 1 can use the capacitor in which the lead terminals 103 are directly joined to the external electrodes 102 as shown in FIG. 7 or the capacitor in which the lead terminals 103 are joined to the external electrodes 102 via the metal plates 104 as shown in FIG. 8.

The metal circuit board 3 is configured such that copper foils 303 of wiring patterns that form electrical circuits are arranged on a metal base plate 301 with high thermal conductivity via an insulating layer 302, the metal base plate 301 being made of, for example, copper or aluminum; and the lead terminals 103 of the snubber capacitor 1 and the semiconductor switches 2a and 2b are respectively joined to the copper foils 303 of the wiring patterns by solder.

Furthermore, a heat dissipation plate 5 is directly joined to the upper surface of the snubber capacitor 1 via an insulating member 4 having a high coefficient of thermal conductivity. As a matter of course, it is preferable that the heat dissipation plate 5 is also made of copper or aluminum and has high thermal conductivity and a large area; because the higher the thermal conductivity and the larger the area are, the better the effect of heat dissipation is. Furthermore, if a portion of the heat dissipation plate 5 corresponding to the upper surface of the snubber capacitor 1 is thicker than other portion thereof, the effect of heat dissipation is further improved.

Further, insulating spacers 6 each formed of an insulating projection or the like are provided between the external electrode 102 of the capacitor 1 and the heat dissipation plate 5; and accordingly, the insulation distance between the external electrode 102 of the capacitor 1 and the heat dissipation plate 5 can be reliably secured.

Incidentally, the insulating member 4 having the high coefficient of thermal conductivity has a coefficient of thermal conductivity of not lower than 0.1 W/m·K, as typified by, for example, graphite sheet, heat conductive gel, gum sheet, gel sheet, silicon gum sheet, silicon grease, and the like.

The aforementioned configuration enables the heat of the snubber capacitor 1 of the ceramic electronic component to be dissipated to the heat dissipation plate 5 via the insulating member 4 having the high coefficient of thermal conductivity, the heat being generated by a peak current that flows during the generation of a switching surge of the semiconductor switching elements 2 and the insulating member 4 intervening between the capacitor 1 and the heat dissipation plate 5; and thus, the aforementioned configuration enables to achieve the snubber capacitor 1 which suppresses the temperature rise of the snubber capacitor 1 and has high reliability.

As a matter of course, the heat derived from the snubber capacitor 1 is also dissipated from the metal circuit board 3 via the lead terminals 103 of the capacitor 1 as usual and the heat is dissipated together with the heat dissipation from the aforementioned heat dissipation plate 5; and therefore, the temperature rise of the snubber capacitor 1 is further suppressed.

Preferred Embodiment 2

Next, a cooling structure of a capacitor and an inverter device according to a preferred embodiment 2 of the present invention will be described with reference to FIG. 2.

Figure 2:
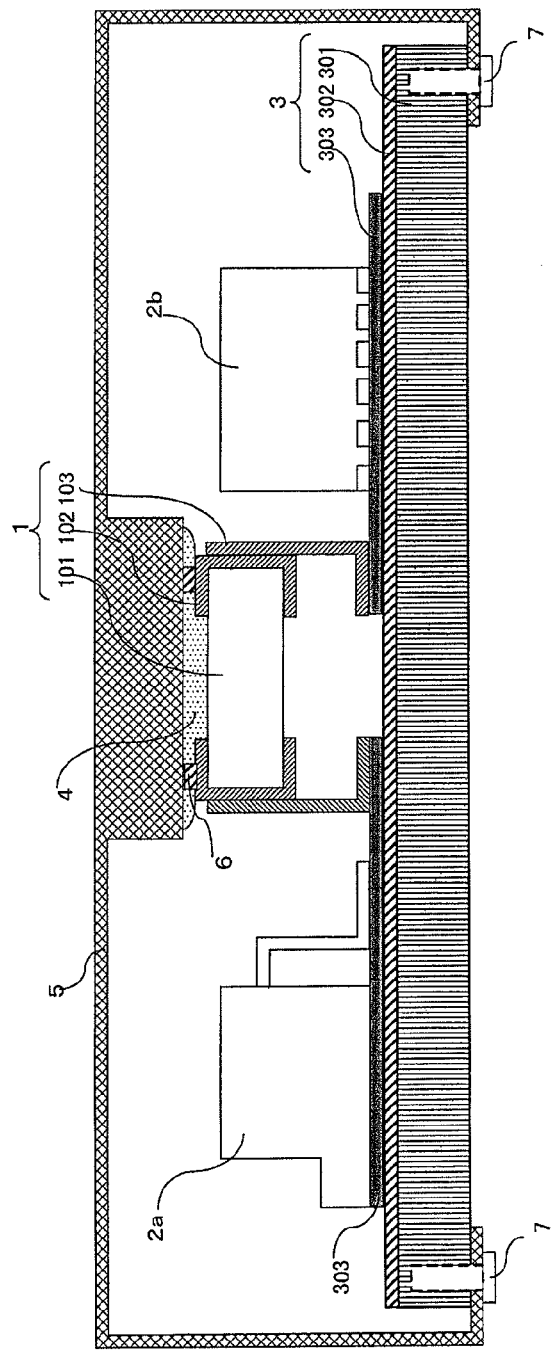
FIG. 2 is a schematic side view showing an inverter device according to a preferred embodiment 2 of the present invention.

FIG. 2 is a schematic side view showing the configuration of the cooling structure of the capacitor and the inverter device using the cooling structure of the capacitor and, in this case, as in FIG. 1, the schematic side view shows only a U phase of an inverter circuit as a representative. Furthermore, an actual inverter device includes a heat sink and an inverter case; however, in this case, the heat sink and the inverter case are not shown. Incidentally, in FIG. 2, the same reference numerals are given to those identical to or equivalent to constituent elements in the preferred embodiment 1 shown in FIG. 1.

The preferred embodiment 2 is different from the preferred embodiment 1 on the points that a heat dissipation plate 5 is extended and the ends thereof and a metal base plate 301 of a metal circuit board 3 are joined by metal screws 7. Other configuration is the same as the preferred embodiment 1; and therefore, the description will not be repeated.

As described above, the heat dissipation plate 5 is joined to the metal base plate 301; and accordingly, the area of the heat dissipation plate 5 can be increased. Furthermore, although not shown in FIG. 2, the metal base plate 301 is connected to the heat sink; and therefore, this enables to achieve the snubber capacitor (laminated ceramic capacitor) 1 in which the effect of heat dissipation is high, the temperature rise of a ceramic electronic component element 101 is suppressed, and reliability is high.

Preferred Embodiment 3

Next, a cooling structure of a capacitor and an inverter device according to a preferred embodiment 3 of the present invention will be described with reference to FIG. 3.

Figure 3:
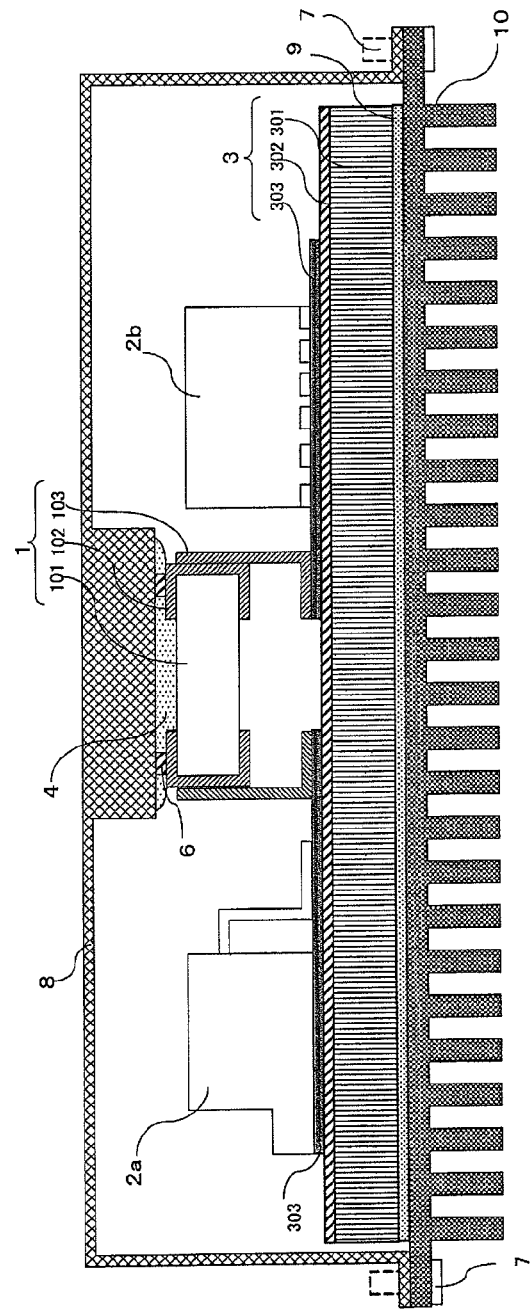
FIG. 3 is a schematic side view showing an inverter device according to a preferred embodiment 3 of the present invention.

FIG. 3 is a schematic side view showing the configuration of the cooling structure of the capacitor and the inverter device using the cooling structure of the capacitor and, in this case, as in FIG. 1, the schematic side view shows only a U phase of an inverter circuit as a representative. Incidentally, in FIG. 3, the same reference numerals are given to those identical to or equivalent to constituent elements in the preferred embodiment 1 shown in FIG. 1.

In the preferred embodiment 3, a snubber capacitor 1 and semiconductor switching elements 2a and 2b that constitute the inverter circuit are mounted on a circuit board 3 and the thus configured snubber capacitor 1 and inverter circuit are covered with an inverter case 8 that is an outer covering; and the inverter case 8 serves as a heat dissipation plate. As a matter of course, the inverter case 8 is made of metal having a high coefficient of thermal conductivity. An insulating member 4 having a high coefficient of thermal conductivity is made to intervene on the upper surface of the snubber capacitor 1 so as to be connected to the inverter case 8.

Further, the inverter case 8 is fixed to a heat sink 10 by metal screws 7, the heat sink 10 being connected to the back surface of a metal base 301 of the circuit board 3 via heat conductive grease 9. Other configuration is the same as the preferred embodiment 1; and therefore, the description will not be repeated.

Such a configuration enables the inverter case 8 of the inverter device to have the same effect of heat dissipation as the heat dissipation plate 5 of the preferred embodiments 1 and 2; and thus, the aforementioned configuration enables to achieve the snubber capacitor (laminated ceramic capacitor) 1 in which the temperature rise of a ceramic electronic component element 101 is suppressed and reliability is high.

Preferred Embodiment 4

Next, a cooling structure of a capacitor and an inverter device according to a preferred embodiment 4 of the present invention will be described with reference to FIG. 4.

Figure 4:
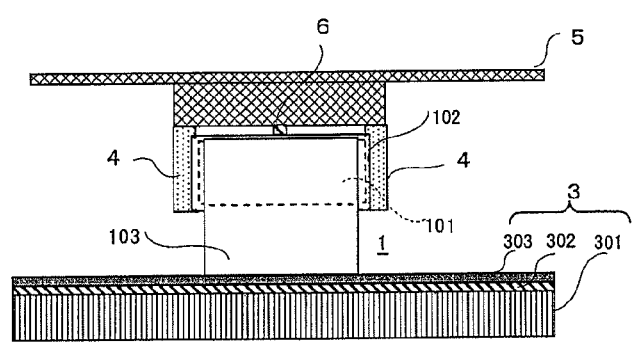
FIG. 4 is a schematic side view showing an inverter device according to a preferred embodiment 4 of the present invention.

FIG. 4 is a schematic side view, in which the side views shown in FIG. 1 to FIG. 3 are seen from the right side or the left side, showing the configuration of the cooling structure of the capacitor; and in this case, an inverter circuit including semiconductor switching elements 2 is not shown. Incidentally, in FIG. 4, the same reference numerals are given to those identical to or equivalent to constituent elements in the preferred embodiment 1 shown in FIG. 1.

The insulating member 4 having the high coefficient of thermal conductivity is joined to the upper surface of the snubber capacitor 1 in the preferred embodiment 1 to the preferred embodiment 3; however, in the invention of the preferred embodiment 4, insulating members 4 each having a high coefficient of thermal conductivity are provided by being joined to the side surfaces of a snubber capacitor 1.

More specifically, in FIG. 4, the insulating members 4 each having the high coefficient of thermal conductivity are joined to the side surfaces of a ceramic electronic component element 101 where external electrodes 102 and lead terminals 103 of the snubber capacitor 1 are not provided, and the upper surfaces of the insulating members 4 each having the high coefficient of thermal conductivity are joined to a heat dissipation plate 5.

Such a configuration enables the heat of the snubber capacitor 1 of the ceramic electronic component to be dissipated to the heat dissipation plate 5 via the insulating member 4 having the high coefficient of thermal conductivity, the heat being generated by a peak current that flows during the generation of a switching surge of the semiconductor switching elements 2 and the insulating member 4 intervening between the side surface of the capacitor 1 and the heat dissipation plate 5; and thus, the aforementioned configuration enables to achieve the snubber capacitor 1 consisting of a laminated ceramic capacitor, which suppresses the temperature rise of the snubber capacitor 1 and has high reliability.

In addition, when the insulating member 4 having the high coefficient of thermal conductivity according to the invention of the preferred embodiment 4 and the insulating member 4 having the high coefficient of thermal conductivity according to the invention of the preferred embodiments 1 to 3 are used together, the snubber capacitor 1 consisting of the laminated ceramic capacitor, which further suppresses the temperature rise of the snubber capacitor 1 and has high reliability, can be achieved.

Preferred Embodiment 5

Next, a cooling structure of a capacitor and an inverter device according to a preferred embodiment 5 of the present invention will be described with reference to FIG. 5.

Figure 5:
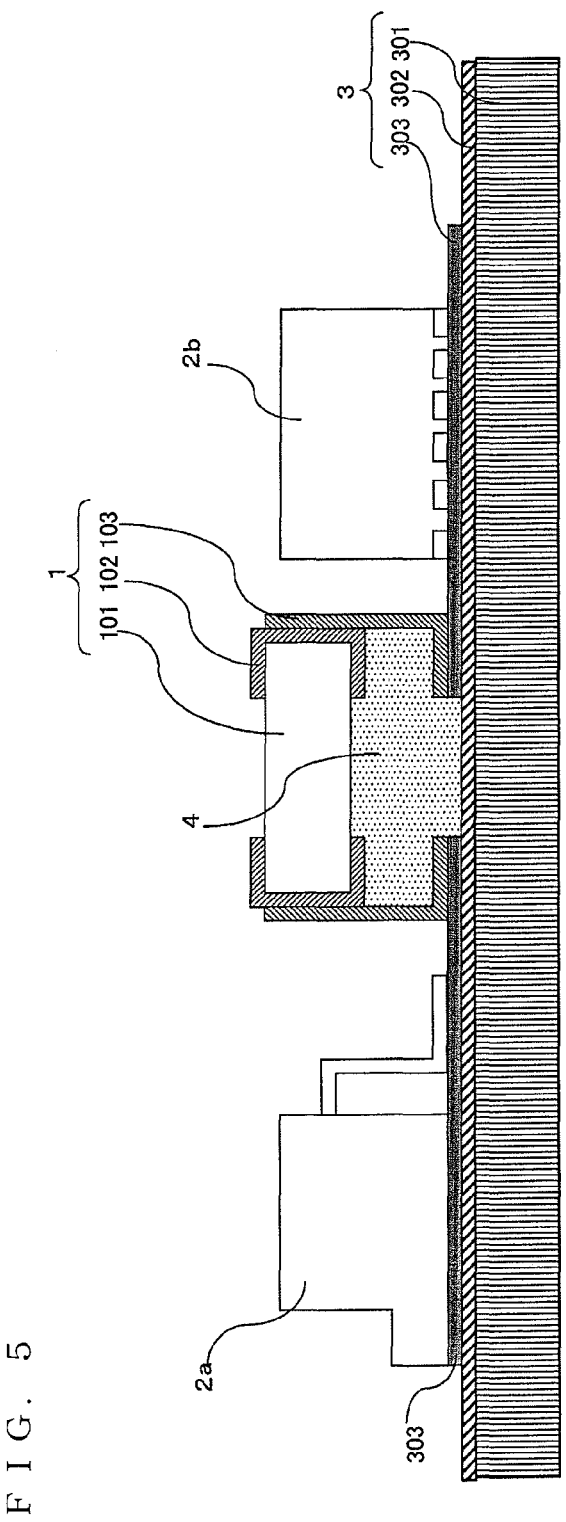
FIG. 5 is a schematic side view showing an inverter device according to a preferred embodiment 5 of the present invention.
Figure 6:
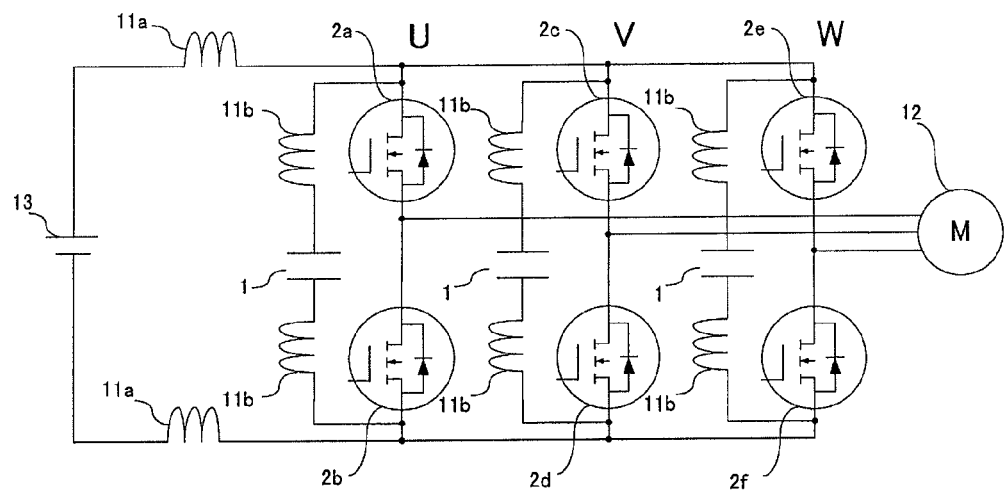
FIG. 6 is a circuit diagram of an inverter device.

FIG. 5 is a schematic side view showing the configuration of the cooling structure of the capacitor and the inverter device using the cooling structure of the capacitor and, in this case, as in FIG. 1, the schematic side view shows only a U phase of an inverter circuit as a representative. Furthermore, an actual inverter device includes a heat sink and an inverter case; however, in this case, the heat sink and the inverter case are not shown. Incidentally, in FIG. 5, the same reference numerals are given to those identical to or equivalent to constituent elements in the preferred embodiment 1 shown in FIG. 1.

The invention of the preferred embodiment 5 is different from the preferred embodiment 1 on the points that, as shown in FIG. 5, an insulating member 4 having a high coefficient of thermal conductivity is provided between each of the inner sides of lead terminals 103 of a snubber capacitor 1 consisting of a laminated ceramic capacitor and an insulating layer 302 of a circuit board 3 and the heat dissipation plate 5 is not used. Other configuration is the same as the preferred embodiment 1; and therefore, the description will not be repeated.

By such a configuration, the heat of the snubber capacitor 1 consisting of a ceramic electronic component 101 is dissipated to the metal circuit board 3 via the insulating member 4 having the high coefficient of thermal conductivity in addition to the lead terminals 103 of the snubber capacitor 1, the heat being generated by a peak current that flows during the generation of a switching surge of semiconductor switching elements 2; and therefore, the effect of heat dissipation can be further enhanced as compared to the heat dissipation by only the lead terminals 103 of the snubber capacitor 1.

Furthermore, the aforementioned configuration enables to achieve the snubber capacitor 1 with a simple configuration and improved reliability because the heat dissipation plate 5 of the preferred embodiment 1 is not used.

Incidentally, in the preferred embodiment 5, the insulating member 4 having the high coefficient of thermal conductivity is provided under the snubber capacitor 1 consisting of the ceramic electronic component 101; however, the same effect can be achieved even the insulating member 4 is joined to the side surfaces of the snubber capacitor 1.

Furthermore, it is to be clearly understood to those skilled in the art that the present invention is not limited to the above-mentioned embodiments, but various other embodiments can be made in the scope of the present invention.

For example, the capacitor 1 is not limited to the snubber capacitor 1 for use in the inverter device, but the capacitor 1 can be applied to the cooling structure of a general capacitor.

What is claimed is:

1. A cooling structure of a capacitor comprising:
   a circuit board in which wiring patterns are formed on a metal base plate via an insulating layer;
   a capacitor consisting of a ceramic electronic component which is connected to the wiring patterns of said circuit board via lead terminals and has external electrodes joined to said lead terminals;
   a heat dissipation plate which is made of metal that dissipates the heat generated by said capacitor; and
   an insulating member which is provided on the upper surface or the side surface of said capacitor and intervenes between said heat dissipation plate and said capacitor, said insulating member having a high coefficient of thermal conductivity.

2. The cooling structure of the capacitor according to claim 1,
   wherein said heat dissipation plate is joined to said metal base plate of said circuit board.

3. The cooling structure of the capacitor according to claim 1,
further comprising a heat sink which is joined to said metal base plate of said circuit board,
said heat sink being joined to said heat dissipation plate.

4. The cooling structure of the capacitor according to claim 1,
further comprising an insulating spacer which is provided between said external electrodes of said capacitor and said heat dissipation plate.

5. The cooling structure of the capacitor according to claim 1,
wherein said insulating member having the high coefficient of thermal conductivity has a coefficient of thermal conductivity of not lower than 0.1 W/m·K.

6. A cooling structure of a capacitor comprising:
a circuit board in which wiring patterns are formed on a metal base plate via an insulating layer;
a capacitor consisting of a ceramic electronic component which is connected to the wiring patterns of said circuit board via lead terminals and has external electrodes joined to said lead terminals; and
an insulating member which is provided on the inner sides of said lead terminals of said capacitor and intervenes between said circuit board and said capacitor, said insulating member having a high coefficient of thermal conductivity.

7. The cooling structure of the capacitor according to claim 6,
wherein said insulating member having the high coefficient of thermal conductivity has a coefficient of thermal conductivity of not lower than 0.1 W/m·K.

8. An inverter device comprising:
a circuit board in which wiring patterns are formed on a metal base plate via an insulating layer;
an inverter circuit which is arranged on said circuit board and is configured by a plurality of semiconductor switching elements for converting electric power;
a capacitor consisting of a ceramic electronic component which is connected to the wiring patterns of said circuit board via lead terminals in parallel to said semiconductor switching elements and has external electrodes joined to said lead terminals;
a heat dissipation plate which is made of metal that dissipates the heat generated by said capacitor; and
an insulating member which is provided on the upper surface or the side surface of said capacitor and intervenes between said heat dissipation plate and said capacitor, said insulating member having a high coefficient of thermal conductivity.

9. An inverter device comprising:
a circuit board in which wiring patterns are formed on a metal base plate via an insulating layer;
an inverter circuit which is arranged on said circuit board and is configured by a plurality of semiconductor switching elements for converting electric power;
a capacitor consisting of a ceramic electronic component which is connected to the wiring patterns of said circuit board via lead terminals in parallel to said semiconductor switching elements and has external electrodes joined to said lead terminals; and
an insulating member which is provided on the inner sides of said lead terminals of said capacitor and intervenes between said circuit board and said capacitor, said insulating member having a high coefficient of thermal conductivity.

* * * * *